US012170523B2

(12) United States Patent
Zhang et al.

(10) Patent No.: US 12,170,523 B2
(45) Date of Patent: Dec. 17, 2024

(54) CURRENT-TO-DIGITAL CONVERTER

(71) Applicant: Agency for Science, Technology and Research, Singapore (SG)

(72) Inventors: Tantan Zhang, Singapore (SG); Yuan Gao, Singapore (SG)

(73) Assignee: AGENCY FOR SCIENCE, TECHNOLOGY AND RESEARCH, Singapore (SG)

(*) Notice: Subject to any disclaimer, the term of this patent is extended or adjusted under 35 U.S.C. 154(b) by 151 days.

(21) Appl. No.: 17/997,967

(22) PCT Filed: Apr. 27, 2021

(86) PCT No.: PCT/SG2021/050232
§ 371 (c)(1),
(2) Date: Dec. 2, 2022

(87) PCT Pub. No.: WO2021/225518
PCT Pub. Date: Nov. 11, 2021

(65) Prior Publication Data
US 2023/0179221 A1 Jun. 8, 2023

(30) Foreign Application Priority Data

May 4, 2020 (SG) .............................. 10202004084S

(51) Int. Cl.
H03M 1/46 (2006.01)
H03M 3/00 (2006.01)
H03M 1/66 (2006.01)

(52) U.S. Cl.
CPC ............. *H03M 1/46* (2013.01); *H03M 3/426* (2013.01); *H03M 3/458* (2013.01); *H03M 1/662* (2013.01); *H03M 3/50* (2013.01)

(58) Field of Classification Search
CPC ........ H03M 1/46; H03M 3/426; H03M 3/458; H03M 3/50; H03M 1/662
See application file for complete search history.

(56) References Cited

U.S. PATENT DOCUMENTS

2022/0327370 A1* 10/2022 Huynh .................. H03M 3/458

* cited by examiner

*Primary Examiner* — Joseph J Lauture
(74) *Attorney, Agent, or Firm* — Mark H. Whittenberger; Holland & Knight LLP

(57) ABSTRACT

This disclosure relates to a current-to-digital converter suitable for wide-ranging current sensing applications. In particular, the current-to-digital converter comprises a delta-sigma analogue-to-digital converter which utilizes a successive-approximation-register to control a modulation of the sensed current so that the digital conversion of the modulated sensed current by the delta-sigma analogue-to-digital converter may be done with high precision.

12 Claims, 9 Drawing Sheets

CURRENT-TO-DIGITAL CONVERTER

RELATED APPLICATIONS

The subject application is a U.S. National Stage application of International Application No. PCT/SG2020/050232, filed on 27 Apr. 2021 which claims the benefit of Singapore Patent Application No. 10202004084S, filed on 4 May 2020. The contents of which are herein incorporated by reference in their entirety.

FIELD OF THE INVENTION

This invention relates to a current-to-digital converter suitable for wide-ranging current sensing applications. In particular, the current-to-digital converter comprises a delta-sigma analogue-to-digital converter which utilizes a successive-approximation-register to control a modulation of the sensed current so that the digital conversion of the modulated sensed current by the delta-sigma analogue-to-digital converter may be done with high precision.

SUMMARY OF THE PRIOR ART

A wide-ranging current-to-digital converter is essential in applications that required high precision wide-range current measurements such as gas sensing and bio-chemical sensing applications. In these applications, the current range that is to be sensed varies from several pico-ampere to several micro-amperes. In order to achieve this, the current-to-digital converter would need to have a wide dynamic range of about 120 dB and a high linearity of more than 80 dB while ensuring that its power dissipation is low.

In view of the above, those skilled in the art have proposed a few approaches. The most straightforward method proposed by those skilled in the art is to employ a low-noise trans-impedance amplifier (TIA) followed by an adapted analogue-to-digital converter (ADC) as the current-to-digital converter for such applications. However, the use of a power-hungry TIA and ADC dissipates large static power and as a result, this greatly limits the dynamic range of the current-to-digital converter.

In another approach, it is proposed that the current to be sensed be directly converted into a digital form, and this is to be done using an existing ADC operated in current mode. For example, it has been proposed that a low power voltage-controlled oscillator (VCO) based current-to-digital converter (CDC) be used. This VCO based CDC utilized a VCO-based quantizer followed by a digital differentiator to realize a $2^{nd}$ order noise-shaping. However, its precision is affected by the flicker noise caused by the current-steering of the digital-to-analogue converter (DAC). Consequently, it was only able to achieve a dynamic range of only 73 dB.

Another CDC architecture proposed by those skilled in the art does not utilize amplifiers and as a result, it consumes lower power. In this approach, dynamic-element-matching (DEM) is employed to suppress the mismatches in the current-steering DAC to improve its linearity. However, it was only able to achieve a dynamic range of about 88.9 dB over an input range of 200 nA to 3 µA. In yet another proposed approach, a wide dynamic range CDC which was realized using a revised asynchronous delta-sigma modulator was demonstrated to be able to achieve a dynamic range of about 160 dB over an input range between 100 fA and 10 µA. However, this approach is not ideal as it requires complicated DEM controls and backend calibration, which results in much greater power consumption.

In still yet another approach, it was proposed that a fully integrated low noise CDC be realized based on current-mode continuous time delta-sigma modulators. Both transistor based and capacitor based current divisions were used to reduce the reference current noise however, due to the usage of power-hungry amplifiers in this design, several mW of power were consumed when the CDC was in operation making it unsuitable for use in energy-constrained systems. Existing delta-sigma current-to-digital converters also require on-chip current references that are larger in value than the input current that is to be sensed and these on-chip current references are usually implemented using multi-bit digital-to-analogue converters operating in current mode. The downside to this approach is that the amount of power consumed by this design dramatically increases when the large input currents are sensed.

In summary, all the proposed CDCs above are unable to achieve a dynamic range of at least 100 dB with low power consumption, e.g. a power consumption of a few µW, while maintaining a wide-range sub-pA current sensitivity at its input. For those reasons, those skilled in the art are constantly striving to come up with ways to design a low-power, high-precision current-to-digital converter that has a wide dynamic range, (>119 dB).

SUMMARY OF THE INVENTION

The above and other problems are solved and an advance in the art is made by systems and methods provided by embodiments in accordance with the invention.

A first advantage of embodiments of a circuit and method in accordance with the invention is that the current-to-digital converter has a wide input current sensing dynamic range and low power consumption as the converter utilizes a small on-chip current reference.

A second advantage of embodiments of a circuit and method in accordance with the invention is that the current-to-digital converter is able to convert sensed current into digital signals with high precision due to the use of a successive-approximate-register conversion technique to determine the modulation ratio of the sensed current before the modulated sensed current is processed by a delta-sigma converter.

A third advantage of embodiments of a circuit and method in accordance with the invention is that due to the use of a 1-bit current digital-to-analogue converter as the feedback for the delta-sigma analogue-to-digital converter, the current-to-digital converter is able to achieve a highly linear performance.

The above advantages are provided by embodiments of a device or method in accordance with the invention operating in the following manner.

According to a first aspect of the invention, a current-to-digital converter module is disclosed, the module comprising: a modulation switch, $SW_K$, configured to modulate an input current, $I_{IN}$, to produce a scaled current, $I_{INK}$, wherein the switch $SW_K$ is controlled by a modulation clock $F_K$; a delta-sigma analogue-to-digital converter, $\Delta\Sigma$ ADC, comprising an integrator coupled to a hysteresis comparator that is coupled to a D-type Flip-Flop being driven by a master clock, $F_S$, whereby an inverting output from the D-type Flip-Flop is coupled to an inverting input of the integrator using a 1-bit feedback current digital-to-analogue converter, DAC, the $\Delta\Sigma$ ADC being configured to generate digital outputs at a non-inverting output and the inverting output of the D-type Flip-Flop based on a balanced current, $I_{BAL}$, received at the inverting input of the integrator, whereby the balanced current $I_{BAL}$ comprises a summation of the scaled current $I_{INK}$ with a reference current, $I_{REF}$, produced by the 1-bit feedback current DAC; a successive-approximation-register (SAR) control logic configured to generate control signals based on the non-inverting outputs from the D-type Flip-Flop, a reset clock signal and the master clock $F_S$; and a clock generator module that is driven by the master clock, $F_S$, being configured to use the control signals from the SAR control logic to determine an optimal modulation clock $F_K$ for controlling the switch $SW_K$.

In accordance with a first aspect of the invention, the modulation switch $SW_K$ comprises: a transmission gate switch that is body biased with a reference voltage $V_{CM}$ when the switch is at an OFF-state, wherein the reference voltage $V_{CM}$ is used as the reference voltage at the non-inverting inputs of the integrator and hysteresis comparator of the ΔΣ ADC.

In accordance with a first aspect of the invention, the integrator of the ΔΣ ADC comprises: a two-stage integrator circuit having a first and a second stage, wherein a compensation capacitor $C_C$ couples a low impedance node of the first stage to an output of the second stage.

In accordance with a first aspect of the invention, the hysteresis comparator of the ΔΣ ADC comprises: an inverter based hysteresis comparator circuit having an inverter provided at the input of the compactor circuit, wherein a threshold voltage of the inverter is similar as threshold voltages of transistors used in the comparator circuit.

In accordance with a first aspect of the invention, the 1-bit feedback current DAC comprises: a cascaded current mirror circuit.

In accordance with a first aspect of the invention, the clock generator module comprises: a plurality of D-type Flip Flop, logic AND gate pairs and a logic OR gate, configured in a frequency divider configuration to generate a modulation pulse.

According to a second aspect of the invention, a method for converting current to digital signals using a current-to-digital converter module having a modulation switch $SW_K$, a delta-sigma analogue-to-digital converter, ΔΣ ADC, comprising an integrator coupled to a hysteresis comparator that is coupled to a D-type Flip-Flop being driven by a master clock, $F_S$, a successive-approximation-register (SAR) control logic, and a clock generator module that is driven by the master clock, $F_S$ is disclosed, the method comprising: modulating, using the modulation switch, $SW_K$, an input current, $I_{IN}$, to produce a scaled current, $I_{INK}$, wherein the switch $SW_K$ is controlled by a modulation clock $F_K$; coupling an inverting output from the D-type Flip-Flop an inverting input of the integrator using a 1-bit feedback current digital-to-analogue converter, DAC, generating, using the ΔΣ ADC, digital outputs at a non-inverting output and the inverting output of the D-type Flip-Flop based on a balanced current, $I_{BAL}$, received at the inverting input of the integrator, whereby the balanced current $I_{BAL}$ comprises a summation of the scaled current $I_{INK}$ with a reference current, $I_{REF}$, produced by the 1-bit feedback current DAC; generating, using the SAR control logic, control signals based on the non-inverting outputs from the D-type Flip-Flop, a reset clock signal and the master clock $F_S$; and determining, using a clock generator module, based on the control signals from the SAR control logic an optimal modulation clock $F_K$ for controlling the switch $SW_K$.

In accordance with a second aspect of the invention, the modulation switch $SW_K$ comprises: a transmission gate switch that is body biased with a reference voltage $V_{CM}$ when the switch is at an OFF-state, wherein the reference voltage $V_{CM}$ is used as the reference voltage at the non-inverting inputs of the integrator and hysteresis comparator of the ΔΣ ADC.

In accordance with a second aspect of the invention, the integrator of the ΔΣ ADC comprises: a two-stage integrator circuit having a first and a second stage, wherein a compensation capacitor $C_C$ couples a low impedance node of the first stage to an output of the second stage.

In accordance with a second aspect of the invention, the hysteresis comparator of the ΔΣ ADC comprises: an inverter based hysteresis comparator circuit having an inverter provided at the input of the compactor circuit, wherein a threshold voltage of the inverter is similar as threshold voltages of transistors used in the comparator circuit.

In accordance with a second aspect of the invention, the 1-bit feedback current DAC comprises a cascaded current mirror circuit.

In accordance with a second aspect of the invention, the clock generator module comprises: a plurality of D-type Flip Flop, logic AND gate pairs and a logic OR gate, configured in a frequency divider configuration to generate a modulation pulse.

BRIEF DESCRIPTION OF THE DRAWINGS

The above advantages and features in accordance with this invention are described in the following detailed description and are shown in the following drawings.

DETAILED DESCRIPTION

This invention relates to a current-to-digital converter suitable for a wide range of current sensing applications. In particular, the current-to-digital converter comprises a delta-sigma analogue-to-digital converter (ΔΣ ADC), which utilizes a successive-approximation-register (SAR) control logic to generate a modulation clock using a clock generator module, whereby the modulation clock is used to control the modulation of a modulation switch $SW_K$. A scaled current $I_{INK}$ is then subsequently generated by modulating the sensed input current $I_{IN}$. The scaled current $I_{INK}$ is then summed with a reference current $I_{REF}$ to produce a balanced current $I_{BAL}$ which is then used as the input to the ΔΣ ADC circuit. This ensures that the digital conversion of the modulated sensed current by the ΔΣ ADC circuit may be done with high precision.

Figure 1:
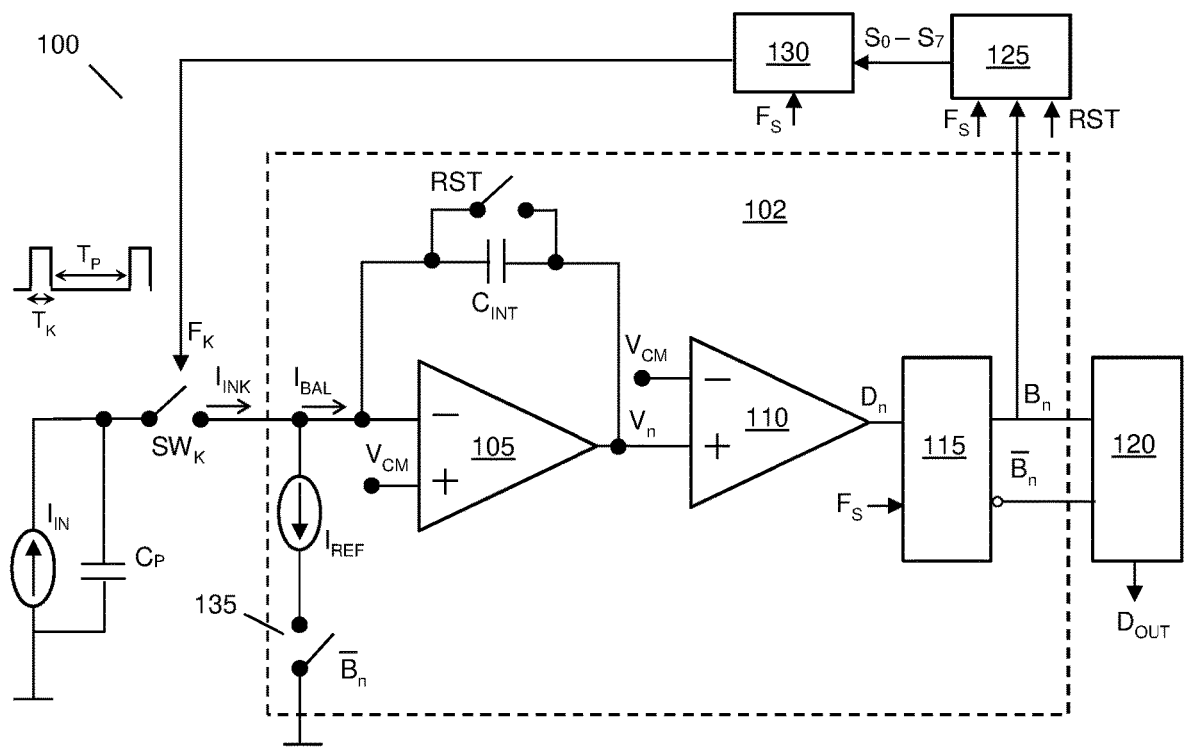
FIG. 1 illustrating a system level block diagram of a current-to-digital converter in accordance with embodiments of the invention.

In accordance with an embodiment of the invention, a system level block diagram of the current-to-digital converter 100 is illustrated in FIG. 1. As illustrated in FIG. 1, it can be seen that converter 100 comprises a modulation switch, $SW_K$, delta-sigma analogue-to-digital converter (ΔΣ ADC) circuit 102, counter/shifter 120, successive-approximate-register (SAR) control logic 125 and clock generator module 130. In accordance with embodiments of the invention, the ΔΣ ADC circuit 102 comprises, but is not limited to, integrator 105 having an output that is coupled to comparator 110 which in turn has its output coupled to D-type Flip-Flop 115. A 1-bit current digital-to-analogue converter (DAC) 135 is then arranged in a feedback configuration between an inverting output of D-type Flip-Flop 115 and an inverting input of integrator 105.

In operation, it can be seen that when an input current is sensed by converter 100, the input current $I_{IN}$ is firstly scaled by a scale factor K to produce scaled current $I_{INK}$. This is done using modulation switch $SW_K$ which is in turn controlled by a modulation clock $F_K$ whose duty cycle is determined by clock generator module 130. The scale factor K is defined as the ratio of $T_p/T_k$, where $T_k$ denotes the period when the modulation switch $SW_K$ is switched "ON", and $T_p$ represents the period when the modulation switch $SW_K$ is switched "OFF". As a result, the average current received by the input of the ΔΣ ADC circuit 102 of current-to-digital converter 100 is scaled down by a scale factor K. This is advantageous as it significantly reduces the on-chip reference current of current-to-digital converter 100.

The scaled current $I_{INK}$ is then summed with a reference current $I_{REF}$ at the input of the ΔΣ ADC circuit 102 to produce a balanced current $I_{BAL}$. The balanced current $I_{BAL}$ will then be integrated using integrator 105 to produce an output voltage. It should be noted that integrator 105 may be controlled using a reset clock RST. In particular, for each clock cycle, the balanced current $I_{BAL}$ will be integrated at integrating capacitor $C_{INT}$, which is provided between an output of integrator 105 and an inverting input of integrator 105. As a result, the output voltage from integrator 105 may be defined as $V_n$ where n represents the $n^{th}$ clock cycle, i.e. n=1, 2 . . . N. Comparator 110 then receives the output voltage $V_n$ from integrator 105 and compares this voltage with a reference voltage $V_{CM}$ to produce a digital output $D_n$ which is defined as $D_n \in \{-1,1\}$. The output voltage $V_n$ may then be defined as follows:

$$V_n = V_{n-1} + \left(\frac{I_{IN}}{K \cdot I_{REF}} - D_n\right) \cdot \frac{I_{REF}}{F_S \cdot C_{INT}} \quad \text{Equation (1)}$$

$$D_n = \text{sign}(V_{n-1} + D_{n-1} \cdot \Delta) \quad \text{Equation (2)}$$

where Δ is defined as the hysteresis level of comparator 110 and $F_S$ is defined as the master clock of converter 100.

From the equations above, it is shown that $V_n$ is bounded to $$\left(\Delta + \frac{2 \cdot I_{REF}}{F_S \cdot C_{INT}}\right).$$

After N conversion cycles have passed, a hysteresis residue will occur and this hysteresis value is defined by $$\frac{(D_N - D_0) \cdot \Delta}{N}.$$

The value of this residue is larger than that of a conventional non-hysteresis modulator as such, in accordance with embodiments of the invention, comparator 110 may comprise a tune-able hysteresis comparator whose hysteresis range may be adjusted to produce the required resolution.

The digital output $D_n$ is then provided to an input of D-type Flip-Flop 115. Flip-Flop 115 uses digital output $D_n$ to generate bit streams $B_n$ and $\tilde{B}_n$ which are subsequently provided to SAR control logic 125 and 1-bit current DAC 135 respectively. 1-bit current DAC 135 is configured to utilize the bit stream $\tilde{B}_n$ to control the switching of on-chip reference current $I_{REF}$. By doing so, this effectively reduces the number of conversion cycles N required, especially when the input current $I_{IN}$ is much smaller in magnitude as compared to the reference current $I_{REF}$. Furthermore, when the number of conversion cycles N are reduced, this greatly improves the energy efficiency of converter 100. The converter's linearity is also improved as the reduction in the switching of the 1-bit current DAC also reduces interferences caused by substrate noise.

When the bit stream $B_n$, master clock $F_S$, and reset clock RST are provided to SAR control logic 125, SAR control logic 125 will determine the scaling factor K by generating a control signal $S_0 \sim S_7$ for clock generator module 130 to determine the modulation clock $F_K$ that is to be applied to modulation switch $SW_K$. Only one signal in $S_0 \sim S_7$ will be at logic '1' when the output of comparator changes from '0' to '1', and it is that signal that is used to select one of the corresponding output of $F_{K\_2} \sim F_{K\_256}$ to obtain $F_K$.

During the process of determining the scale factor K, the initial scale factor will be based on the most-significant-bit (MSB) ratio of SAR control logic 125 (i.e. K=256). This MSB ratio is then used by clock generator module 130 and master clock $F_S$ to generate the modulation clock $F_K$. After one clock period of master clock $F_S$ has lapsed, the input current $I_{IN}$ would have flowed through modulation switch $SW_K$. The input current $I_{IN}$ would then be continuously subtracted from the reference current $I_{REF}$, as generated by 1-bit current DAC 135, for the remaining cycles of master clock $F_S$. This in turn causes the output voltage $V_n$ of integrator 105 to increase until the output voltage $V_n$ exceeds an upper threshold voltage of comparator 110 causing the digital output $D_n$ of comparator 110 to change. If no changes occur at the digital output $D_n$ of comparator 110, the MSB ratio of SAR control logic 125 will reduce by one-significant bit, i.e. MSB-1. This is realized by the shifter register via D-type Flip Flop in SAR control logic 125 to make the MSB-1 bit as logic '1', the corresponding bit is used in clock generator module 130 together with master clock $F_S$ to obtain new $F_K$. This process repeats until the digital output $D_n$ of comparator 110 changes and when this happens, the converter would have determined the optimum modulation clock signal $F_{K\_OPT}$ that matches with the reference current $I_{REF}$.

Figure 2A:
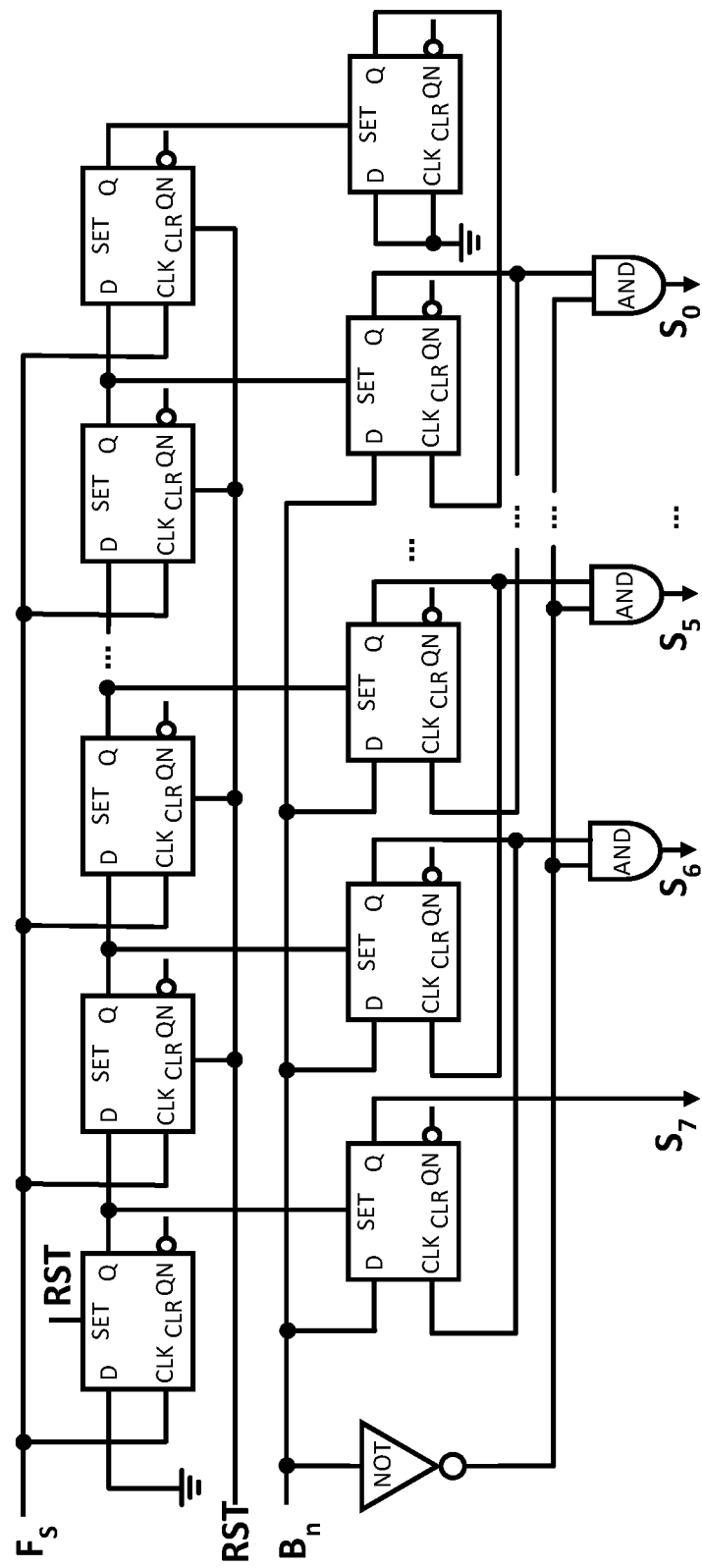
FIG. 2a illustrating an exemplary circuit diagram of a successive-approximation-register (SAR) control logic in accordance with embodiments of the invention.

In accordance with embodiments of the invention, SAR control logic 125, may comprise, but is not limited to, D-type Flip Flops, logic NOT gates, and logic AND gates as illustrated in FIG. 2a. The input signal for this module are master clock $F_S$, reset clock RST, and the positive output $B_n$ of module 115. The SAR logic starts from the MSB, i.e. $S_7$. Unlike conventional SAR logics, as SAR control logic 125 does not have to complete all the ratio searching cycles for various input signals in order to determine the optimum modulation clock signal for converter 100, the approach described above is more energy efficient, effective and more able to adapt to changes in the input signal. This is realized by carrying out the logic AND gate operation between the inverted $B_n$ and all the conventional SAR logic outputs except for the MSB $S_7$ (see FIG. 2a).

In accordance with embodiments of the invention, clock generator module 130, may comprise, but is not limited to, a frequency divider and a logic AND gate driven by master clock $F_S$. This ensures that the accuracy of the scaling factor K is high as compared to methods that utilize Process-Voltage-Temperature (PVT) sensitive analogue methods.

Figure 2B:
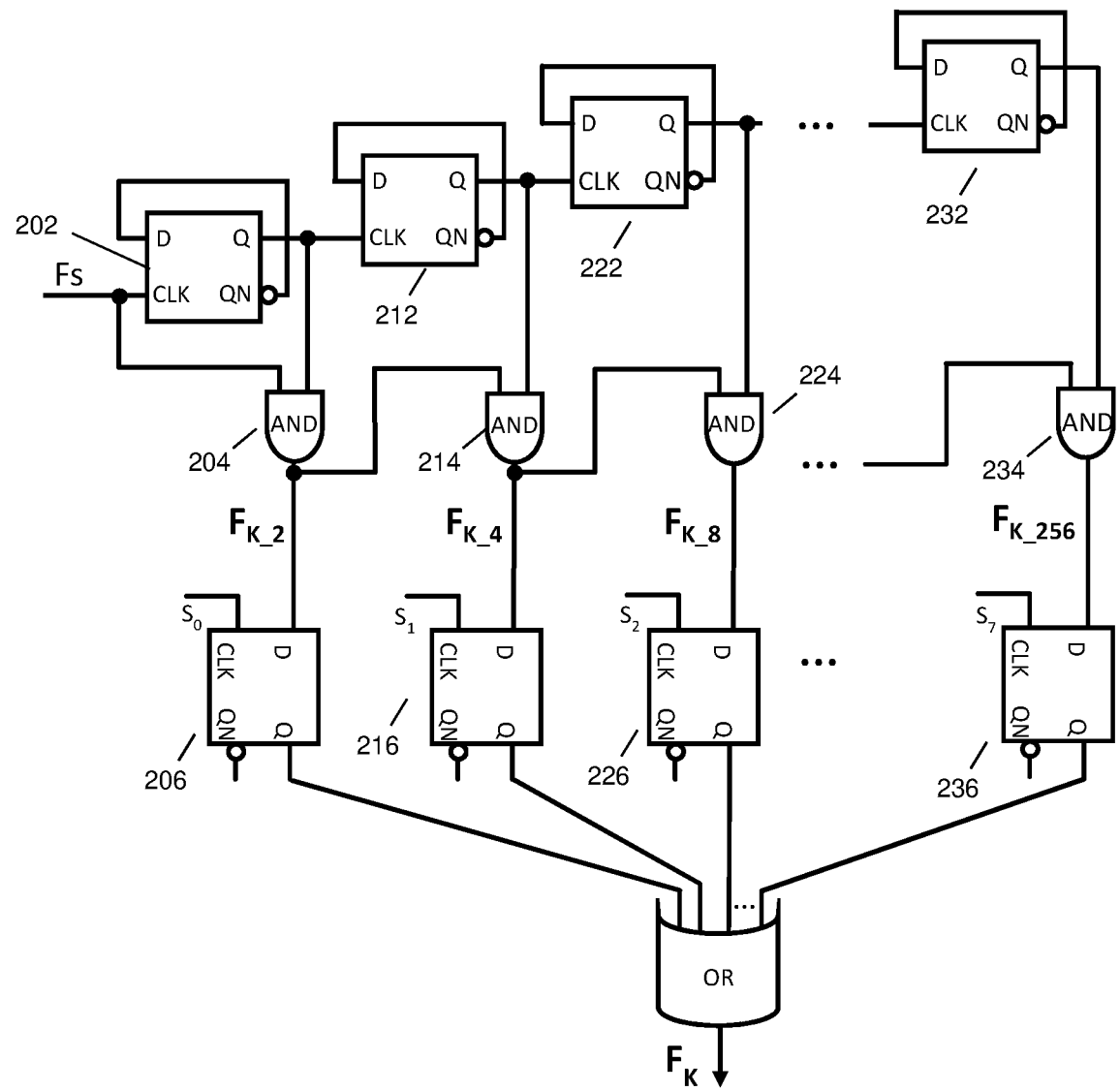
FIG. 2b illustrating an exemplary circuit diagram of the modulator clock generator in accordance with embodiments of the invention.

In embodiments of the invention, an exemplary circuit diagram of clock generator module 130 is illustrated in FIG. 2b and may comprise of 16 D-type flip flops, 8 logic AND gates and an logic OR gate. In FIG. 2b, only D-type flip flops 202, 212, 222, 232, 206, 216, 226, 236, logic AND gates 204, 214, 224, 234, and logic OR gate 208 are illustrated, i.e. a total of 4 pairs and 1 OR gate. One skilled in the art will recognize that the other 8 pairs of D-type flip flops, logic AND gates were omitted from this illustration for brevity. As illustrated, for each of D-type flip flops 202, 212, 222, 232, each D-type flip flop has its output port QN shorted to its input port D to form a frequency divider. For each of D-type flip flops 206, 216, 226, 236, each of these flip flops are configured to receive control signals $S_0$, $S_1$, $S_2$, $S_7$ from SAR control logic 125 at each of their input ports CLK, respectively.

The first D-type flip flop of module 130 is D-type flip flop 202, and this flip flop is configured to receive master clock $F_S$ at input port CLK. Logic AND gate 204 is then configured to receive at its two input ports, master clock $F_S$ and the output signal from output port Q of D-type flip flop 202 to produce output signal $F_{K\_2}$. The next D-type flip flop in this chain is D-type flip flop 212, which is then subsequently configured to receive the output signal from output port Q of D-type flip flop 202 at its input port CLK. Logic AND gate 214 is then configured to receive at its two input ports, the output from logic AND gate 204 (i.e. output signal $F_{K\_2}$) and the output signal from output port Q of D-type flip flop 212 to produce output signal $F_{K\_4}$. Similarly, the next D-type flip flop, D-type flip flop 222 is then configured to receive the output signal from output port Q of D-type flip flop 212 at its input port CLK. Logic AND gate 224 is then configured to receive at its two input ports, the output from logic AND gate 214 (i.e. output signal $F_{K\_4}$) and the output signal from output port Q of D-type flip flop 222 to produce output signal $F_{K\_8}$.

A series of similarly configured "daisy-chained" D-type flip flops and logic AND gates (all not shown) are then used to generate output signals $F_{K\_16}$, $F_{K\_32}$, $F_{K\_64}$, and $F_{K\_128}$. The final D-type flip flop illustrated in this exemplary circuit is D-type flip flop 232, which is configured to receive the output signal from output port Q of a previous D-type flip flop at its input port CLK. The logic AND gate 234 is then configured to receive at its two input ports, the output from a previous logic AND gate (i.e. output signal $F_{K\text{-}128}$) and the output signal from output port Q of D-type flip flop 232 to produce the output signal $F_{K\text{-}256}$. The output signals $F_{K\_2}$, $F_{K\_4}$, $F_{K\_8}$, $F_{K\_16}$, $F_{K\_32}$, $F_{K\_64}$, $F_{K\_128}$ and $F_{K\_256}$ are then provided to the input port D of another 8 D-type flip flops correspondingly and control signals $S_0$, $S_1$, $S_2$, $S_3$, $S_4$, $S_5$, $S_6$, $S_7$ from the SAR control logic 125 are provided to the input port CLK of these 8 D-type flip flops accordingly as illustrated in FIG. 2b. Outputs from output port Q of all the eight (8) D-type flip flops are then provided to a logic OR gate to generate the final signal $F_K$.

Figure 2C:
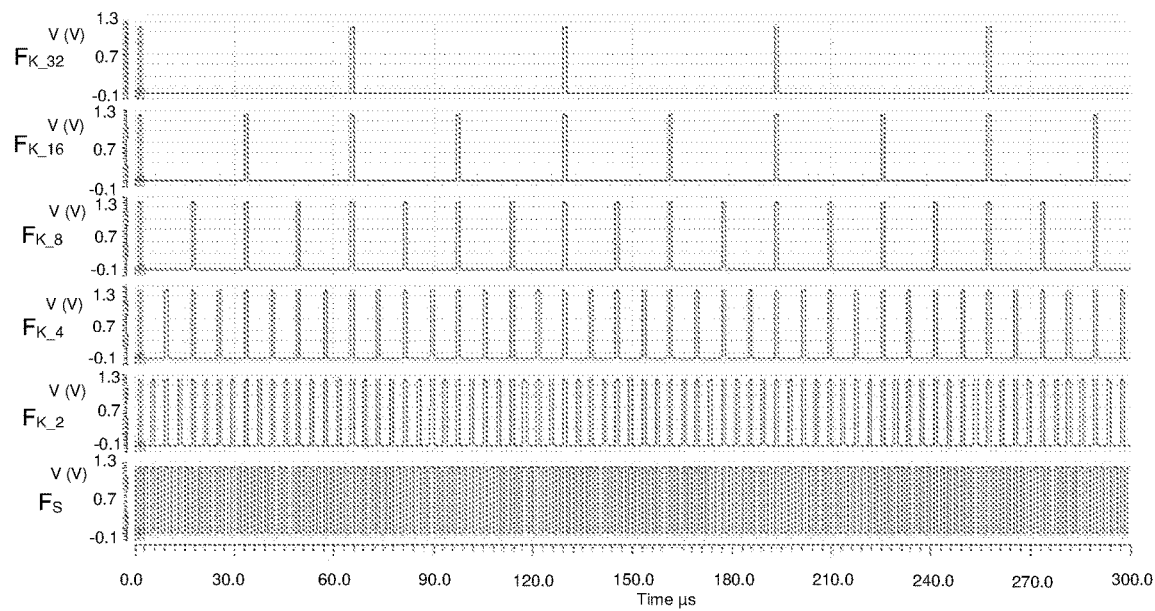
FIG. 2c illustrating timing diagrams of the modulator clock generator shown in FIG. 2a in accordance with embodiments of the invention.
Figure 2D:
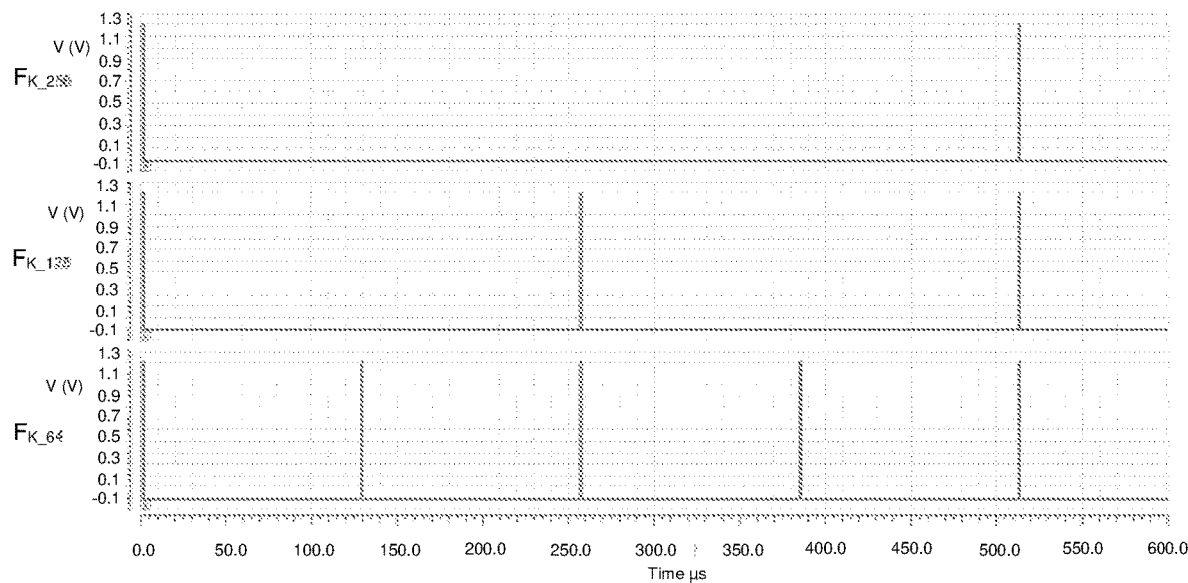
FIG. 2d illustrating timing diagrams of the modulator clock generator shown in FIG. 2a in accordance with embodiments of the invention.

In summary, the modulation clock $F_K$ generated by clock generator module 130 may comprise output signals $F_{K\_2}$, $F_{K\_4}$, $F_{K\_8}$, $F_{K\_16}$, $F_{K\_32}$, $F_{K\_64}$, $F_{K\_128}$ and $F_{K\text{-}256}$ and is controlled by control signals $S_0$, $S_1$, $S_2$, $S_3$, $S_4$, $S_5$, $S_6$, $S_7$ from the SAR control logic 125. The resulting modulation clock $F_K$ generated by the exemplary circuit in FIG. 2b is plotted in FIG. 2c for output signals $F_{K\_2}$, $F_{K\_4}$, $F_{K\_8}$, $F_{K\_16}$, $F_{K\_32}$, and at FIG. 2d for output signals $F_{K\_64}$, $F_{K\_128}$ and $F_{K\_256}$. From the plots in FIGS. 2c and 2d, it can be seen that the ratio between the 'OFF' state periods and the 'ON' state periods are highly accurate, and robust against PVT variations.

Once the optimal modulation clock signal has been determined, during the steady state operation of converter 100, bit streams $B_n$ and $\tilde{B}_n$ will then be provided to a counter/shifter 120. Counter/shifter 120 is provided at the output of $\Delta\Sigma$ ADC circuit 102 and is configured to to act as a decimation filter to produce the digital output $D_{OUT}$ of current-to-digital converter 100. It should be noted during the operation of converter 100, modulation switch $SW_K$ will be in its OFF-state for most of the conversion cycles if large input currents $I_{IN}$ are provided.

Figure 2E:
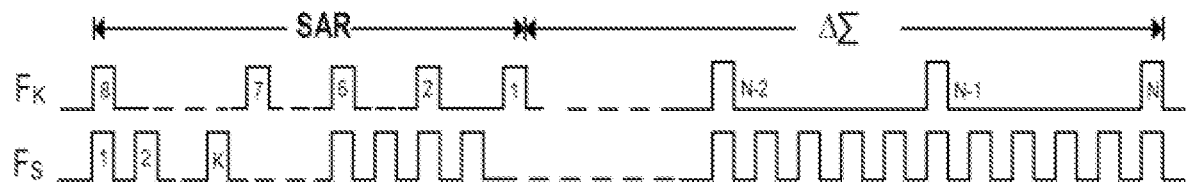
FIG. 2e illustrating a timing diagram of a successive-approximation register and a delta-sigma analogue-to-digital converter in accordance with embodiments of the invention.

FIG. 2e illustrates the timing diagram of the master clock $F_s$ and the modulation clock $F_K$ to determine the optimum modulation clock signal that is to be used by converter 100. The determination process comprises two steps. The first step is to determine the modulation clock via SAR control operation. It starts from the MSB (i.e. K=256), where the output signal for $F_K$ is $F_{K\_256}$ at the output of module 130. If D-type flip flop 115's non-inverting output is changed, then the signal for $F_K$ is maintained at $F_{K\_256}$ at the output of module 130 for the following conversion. Conversely, if D-type flip flop 115's non-inverting output is unchanged, then the output signal for $F_K$ is shifted to be $F_{K\_128}$ at the output of module 130 (and this is controlled by the control signal from SAR control logic 125). These steps then continuously repeat until an optimum modulation clock $F_K$ is determined, i.e. $F_K$ remains unchanged. Once the optimum modulation clock $F_K$ has been determined, SAR control logic 125 will not continue to select the remaining one or several least-significant-bits (LSBs). The second step of the sigma-delta conversion may now commence and operate at the predetermined optimum modulation clock $F_K$ with the master clock $F_S$ to obtain the output bitstreams.

Figure 3A:
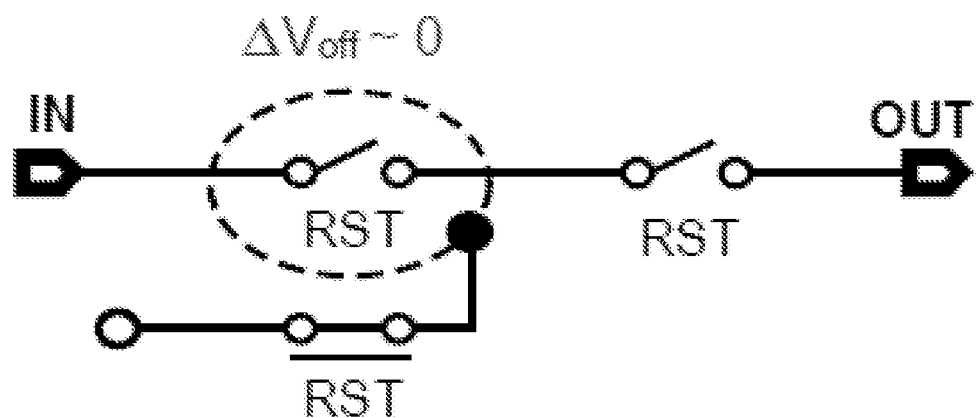
FIG. 3a illustrating a block diagram of a low leakage switch reset switch RST in accordance with embodiments of the invention.
Figure 3B:
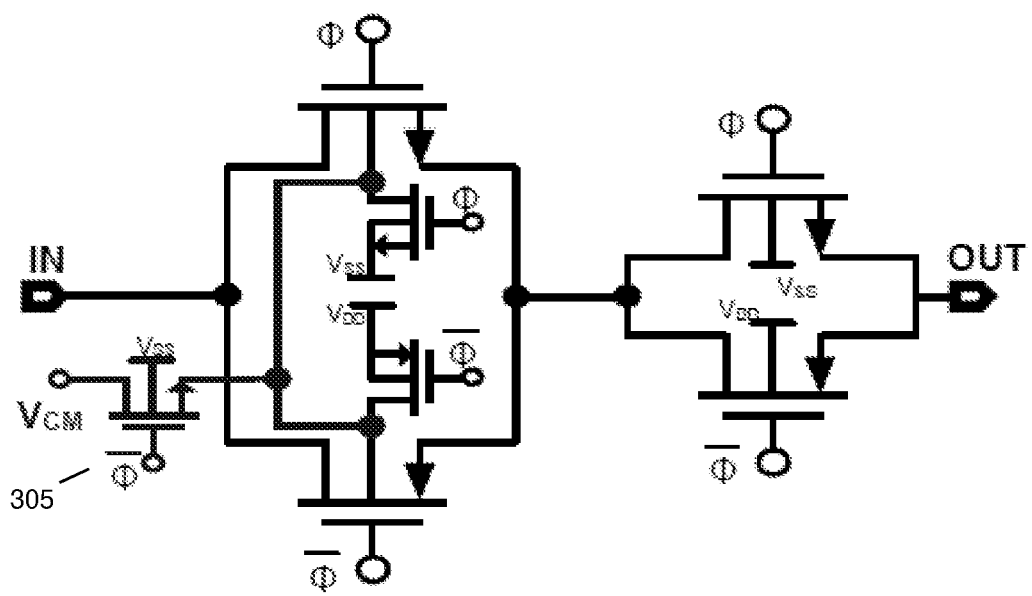
FIG. 3b illustrating a circuit diagram of a low leakage switch $SW_K$ in accordance with embodiments of the invention.

In operation, modulation switch $SW_K$ and reset switch RST (at integrator 105) will be in an "OFF" state for the larger clock cycles. As a result, an appropriate low leakage switch has to be used for the design of these two switches. Such a low leakage reset switch RST is illustrated in FIG. 3a and a low leakage modulation switch $SW_K$ is illustrated in FIG. 3b. With reference to the low leakage switch design illustrated in FIG. 3b, it is shown that a body biased circuit 305 is used to bias the 'body' of the switch with reference voltage $V_{CM}$ when the low leakage switch is in an "OFF"

state. In this design, when the low leakage switch is in an "ON" state, the switch will operate like a conventional transmission gate switch. When the circuit is simulated based on a 40 nm CMOS process, the results show that the leakage current in the circuit may be reduced by about 2 times (~2×), from 140 fA to 72 fA, when the smallest transistor sizes were selected. The detailed workings of the low leakage switch is omitted for brevity as the workings of such a switch are known to those skilled in the art. It should be noted that the body bias technique utilizing the biased circuit 305 may be applied the reset switch RST too.

Figure 4:
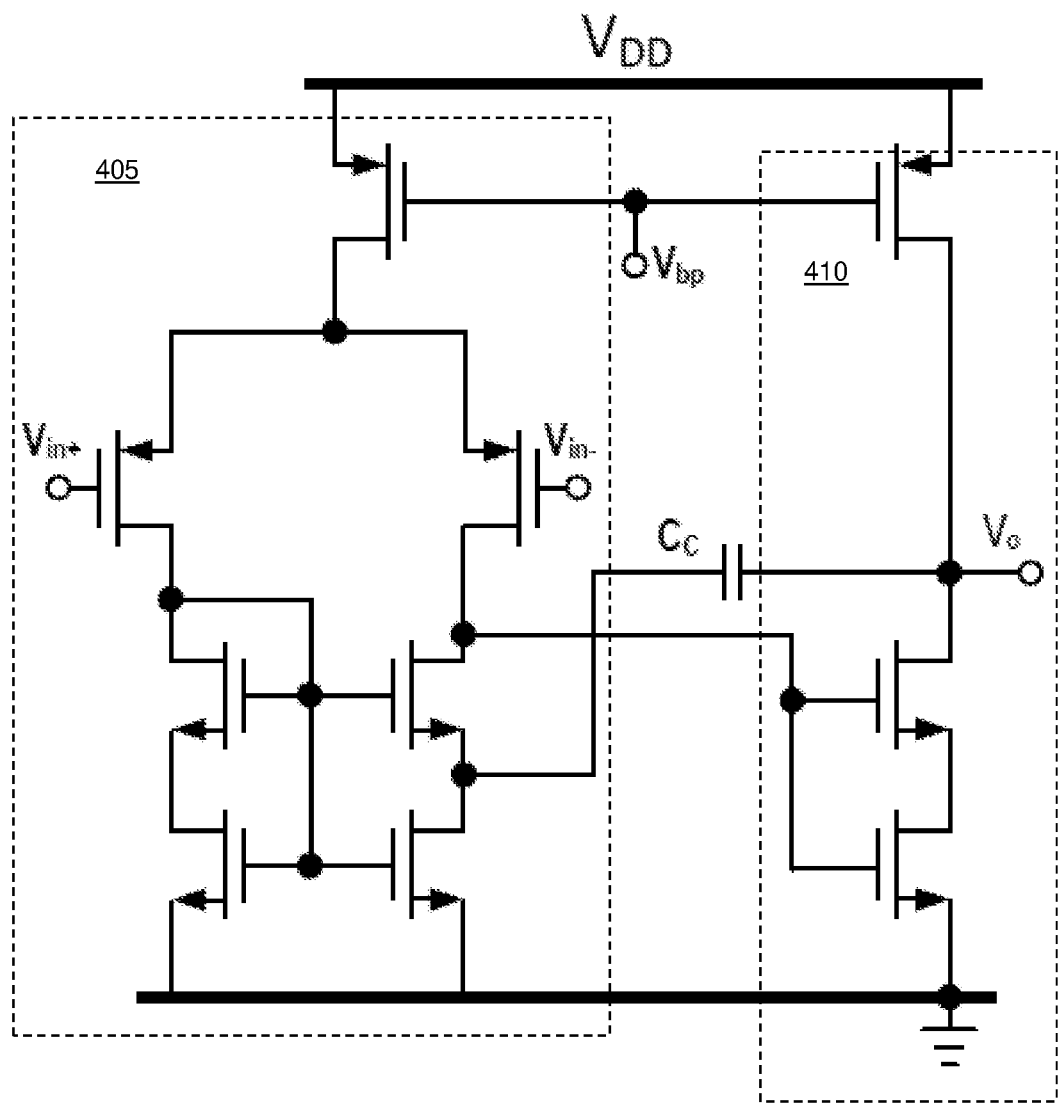
FIG. 4 illustrating a circuit diagram of an integrator in accordance with embodiments of the invention.

The circuit diagram of an integrator that may be used as integrator 105 is illustrated in FIG. 4. The integrator shown in FIG. 4 comprises two stages, a first-stage 405 that is coupled to a second-stage 410. To reduce the power consumption of the circuit without sacrificing bandwidth, an indirect compensation technique using a capacitor $C_C$ is employed in this two-stage design. As illustrated in FIG. 4, the compensation capacitor $C_C$ is connected to the low impedance node of the first stage 405. This ensures that the output stage, i.e. second-stage 410 draws a comparable current as the first stage 405. Furthermore, this increase in the DC gain of the circuit helps to reduce the input referred noise. Based on this design, simulation results based on a 40 nm CMOS process showed that a DC gain of >80 dB was achieved, with a gain-bandwidth product of >8 MHz when the power consumed was 14 μW. Additionally, in embodiments of the invention, large-sized PMOS transistors may be used as the input transistor pairs to reduce the flicker noise below the required noise floor of 100 fA.

Figure 5:
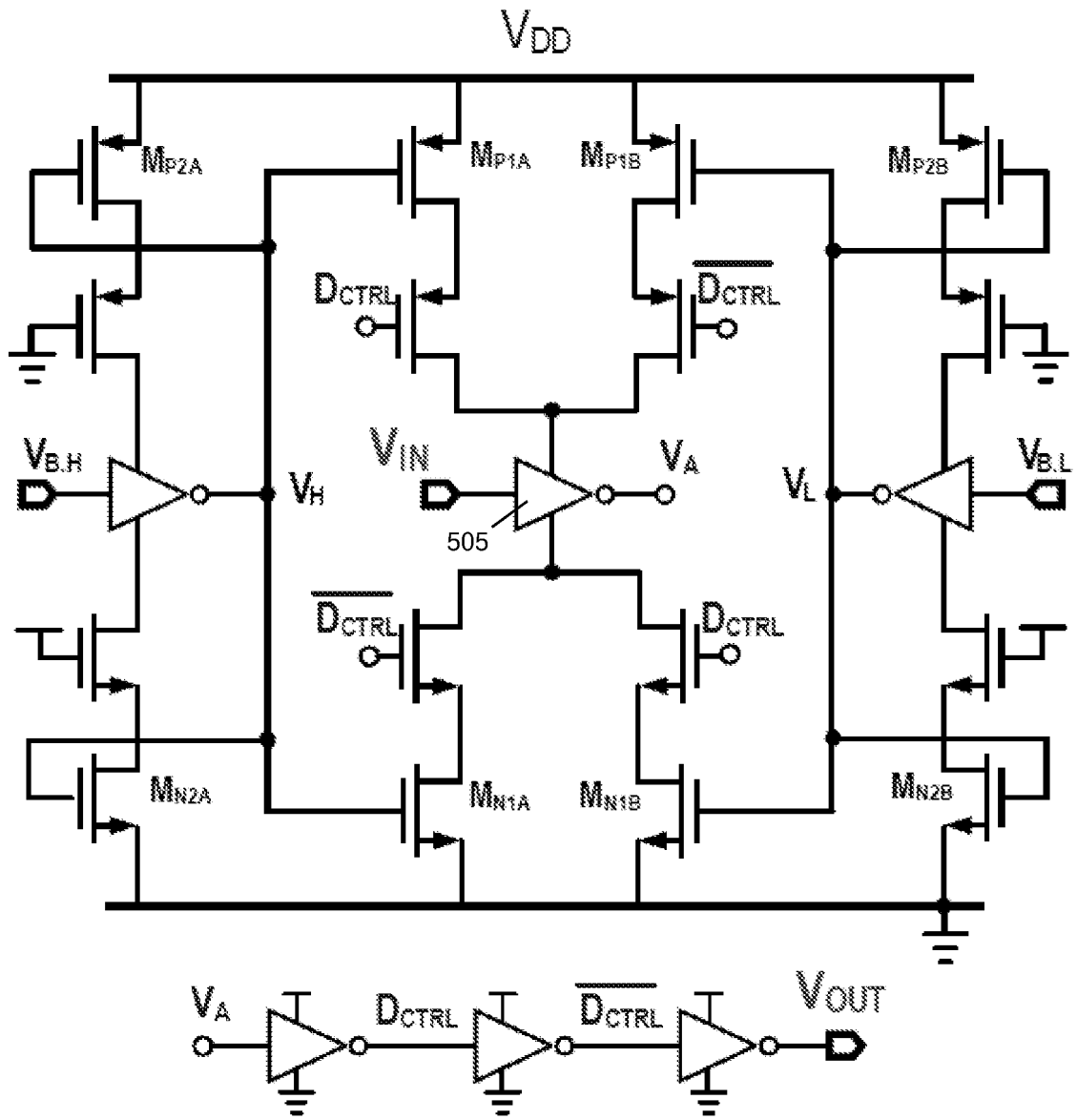
FIG. 5 illustrating circuit diagram of a hysteresis comparator in accordance with embodiments of the invention.

FIG. 5 illustrates the circuit diagram of a modified inverter-based hysteresis comparator that may be used as comparator 110 in accordance with embodiments of the invention. When the circuit in FIG. 5 is compared with conventional hysteresis comparators which consist of pre-amplifier and decision stages, it was found that the circuit in FIG. 5 consumed lower power and did not suffer from PVT variations. This was achieved through the use of inverter 505 which is connected to node $V_{IN}$ (which is configured to receive an input voltage) whereby the threshold voltage of inverter 505 was set to be the same as that of the tuning circuits. The use of inverter 505 allowed the circuit to become insensitive to PVT hysteresis voltages. Additionally, transistors $M_{P2A}$, $M_{N2A}$ ($M_{P2B}$, $M_{N2B}$) are biased in their triode regions using their upper or lower threshold voltages respectively $V_H$ ($V_L$). In addition, the complementarity control signal will select the corresponding lower or upper sides for tuning of the threshold voltage. As such, when the input voltage becomes high or low, the core inverter will be able to operate at the various threshold voltages. When the circuit in FIG. 5 was simulated based on a 40 nm CMOS process, it was shown that the number of maximum variations may be maintained below 1.2 mV.

Figure 6:
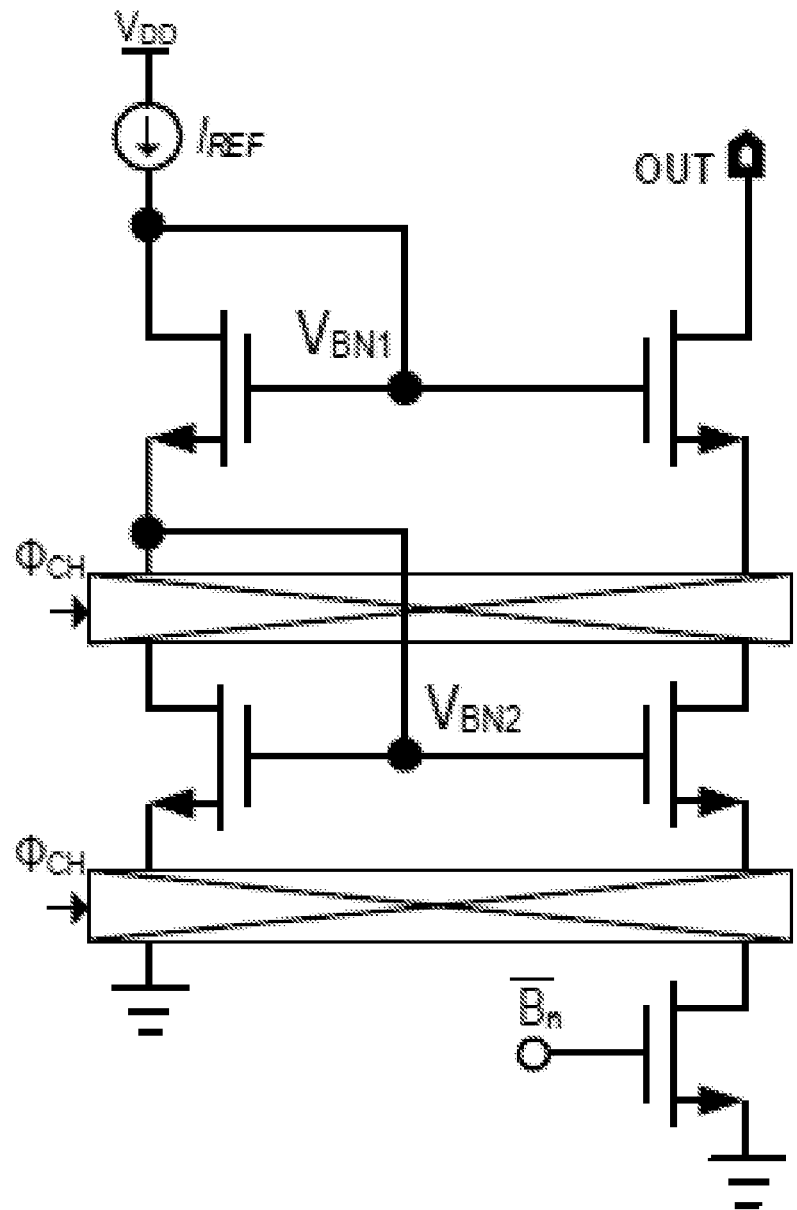
FIG. 6 illustrating a circuit diagram of a 1-bit digital-to-analogue converter in accordance with embodiments of the invention.

FIG. 6 illustrates a circuit diagram of a 1-bit current DAC in accordance with embodiments of the invention. In this embodiment of the invention, the on-chip reference current was chosen to be 20 nA so that it would be able to handle input currents as large as 5 μA. As shown in FIG. 6, the circuit comprises a cascaded current mirror circuit which is designed to copy the reference current with high precision. In order to reduce the non-linear effects such as charge injection and clock feedthrough during the integration step, the switch transistor is connected at its source instead of at its drain. Additionally, to reduce transistor noise, the transistors are designed to have a large length L, and a simple chopping technique is employed. This was found from simulation results to reduce the noise level from 4 μArms to 73 fA within 5 Hz.

Figure 7:
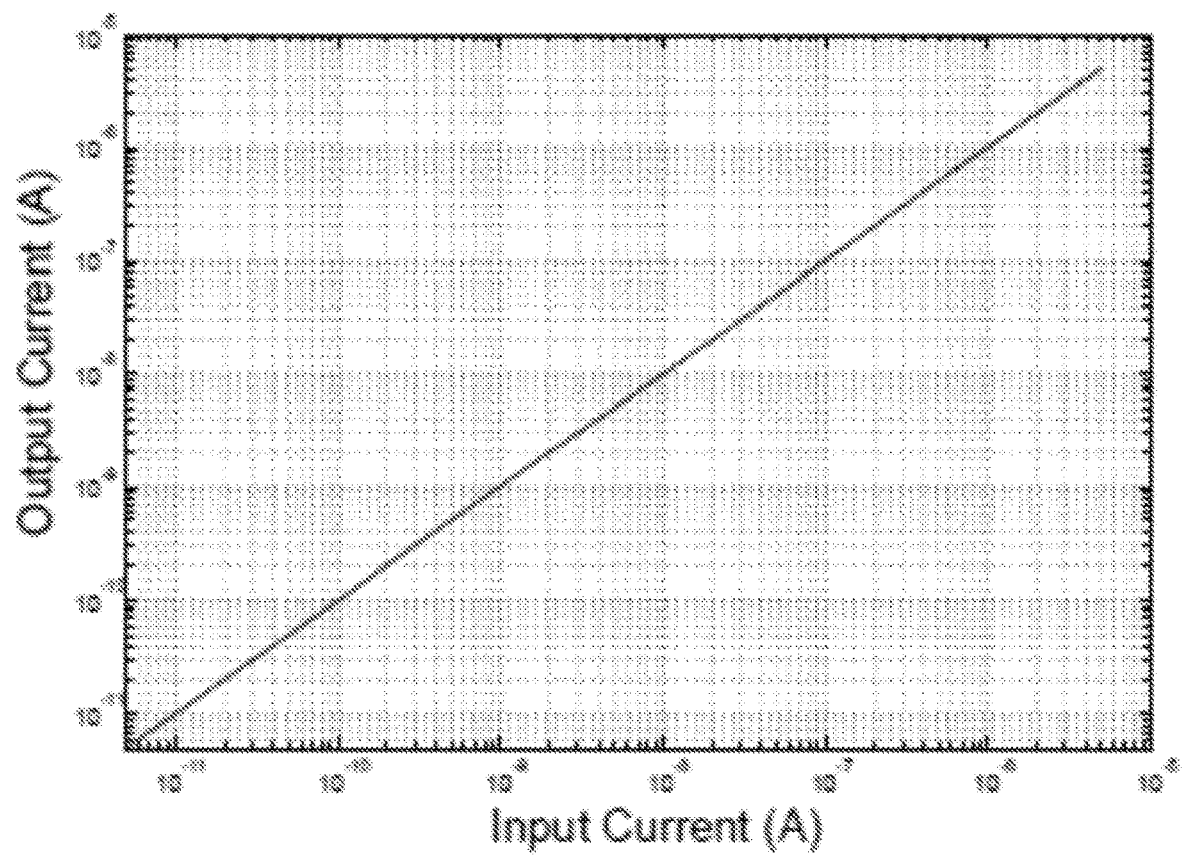
FIG. 7 illustrating a plot of the dynamic range of the output of the current-to-digital converter for input current varying between 5 μA to 5 μA.

Current-to-digital converter 100 was then simulated based on a 40 nm CMOS process and it was found that the converter circuit consumed a total power of 20 μW when the voltage supplied was 1.2V. For the simulation, the sampling frequency was set to be 1.28 MHz, and it was found that the slowest scaling frequency was 5 kHz with K=256 when the input current was at its maximum level. The on-chip reference current was set to be 20 nA. The resulting dynamic range for input current ranging between 5 μA to 5μΔ is plotted in FIG. 7. It can be seen that the output is highly linear and this was achieved due to the use of the 1-bit current DAC.

Figure 8:
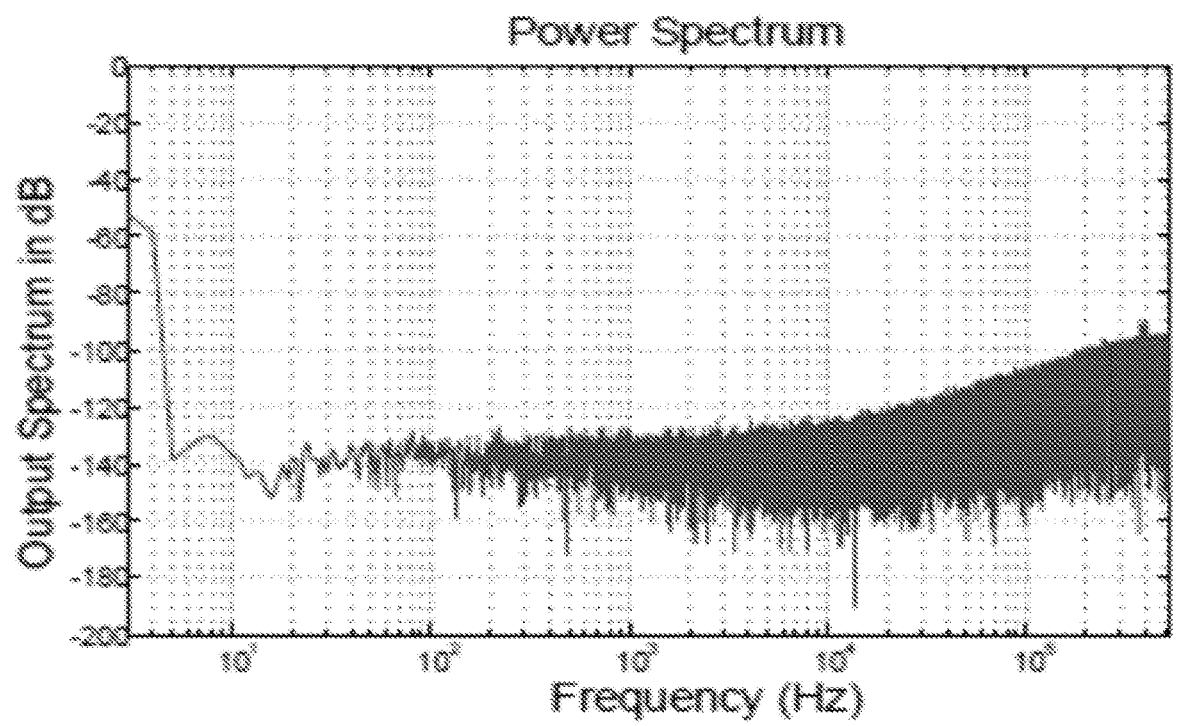
FIG. 8 illustrating a plot of the output spectrum of the current-to-digital converter when an input current of 2 μA is sensed.

The output power spectrum of the circuit is illustrated in FIG. 8. For this plot, a DC input current of 2 μA was applied and a fast-Fourier transform (FFT) was applied to the raw data to produce the plot in FIG. 8. When the conversion time was 200 ms, the input-referred noise was found to be 110 fA within band, and as a result the dynamic range of this design was found to be more than 164 dB.

The performance of converter 100 was benchmarked against other current-to-digital converters known in the art and the comparative benchmarks are plotted below in Table 1. From the results plotted in Table 1, it can be seen that the digital-intensive designs in Prior Art 1 and 2 were able to achieve low power consumption levels, however, their resolutions were limited due to the flicker noise and mismatches in the DAC respectively. Although the converter in Prior Art 3 was able to cover a wider range, it requires calibration and complicated digital correction. As for the converter in Prior Art 4, as it employs multi-current references to cover the current range, the resolution in a fixed-range is just 78.2 dB. The converter in Prior Art 5 utilizes a current mode continuous-time ΔΣ modulator and as a result, extensively larger power is consumed to suppress the noise floor. Among all the current-to-digital converters in the prior art, only converter 100 was able to achieve a sensing range of several pA to pA within tens of microwatt power.

TABLE 1

| Parameters | Prior Art 1 | Prior Art 2 | Prior Art 3 | Prior Art 4 | Prior Art 5 | This work |
|---|---|---|---|---|---|---|
| Architecture | ΔΣ | IIR + ΔΣ | Hourglass ΔΣ | ΔΣ | VCO + ΔΣ | SAR + ΔΣ |
| Process (μm) | 0.35 | 0.18 | 0.18 | 0.35 | 0.18 | 0.04 |
| Supply Voltage (V) | ±1.5 | 1.8 | 1.8 | 1.5 | 5/1.8 | 1.2 |
| Power (μW) | 6730 | 50.3 | 295 | 16.8 | 80 | 22 |
| Sensing range (A) | 1 n | 1.1μ | 0.1 p to 10μ | 200 n to 3μ | 1 n to 4μ | 5 p to 5μ |
| On-chip $I_{REF}$ (μA) | 0.001 | 1 | 10 | 3.2 | 4 | 0.02 |
| Resolution (fA) | 200 | 123 | 100 | 100000 | 1000000 | 110 |
| Fixed-scale DR (dB) | 60 | 78.2 | 104 | 88.9 | 73 | 119 |
| Cross-scale DR (dB) | N.A | 139 | 160 | N.A | 73 | >164 |
| INL(pA) | N.A | N.A | 70 | 100 | 900 | 30 |
| Conv. time for $I_{in\cdot min}$ (ms) | 0.1 | 100 | 400 | 4 | 400 | 200 |
| Calibration | No | No | Yes | No | No | No |

The above is a description of embodiments of a circuit and method in accordance with the present invention as set forth in the following claims. It is envisioned that others may and will design alternatives that fall within the scope of the following claims.

The invention claimed is:

1. A current-to-digital converter module comprising:
   a modulation switch, $SW_K$, configured to modulate an input current, $I_{IN}$, to produce a scaled current, $I_{INK}$, wherein the switch $SW_K$ is controlled by a modulation clock $F_K$;
   a delta-sigma analogue-to-digital converter, ΔΣ ADC, comprising an integrator coupled to a hysteresis comparator that is coupled to a D-type Flip-Flop being driven by a master clock, $F_s$, whereby an inverting output from the D-type Flip-Flop is coupled to an inverting input of the integrator using a 1-bit feedback current digital-to-analogue converter, DAC, the ΔΣ ADC being configured to generate digital outputs at a non-inverting output and the inverting output of the D-type Flip-Flop based on a balanced current, $I_{BAL}$, received at the inverting input of the integrator, whereby the balanced current $I_{BAL}$ comprises a summation of the scaled current $I_{INK}$ with a reference current, $I_{REF}$, produced by the 1-bit feedback current DAC;
   a successive-approximation-register (SAR) control logic configured to generate control signals based on the non-inverting outputs from the D-type Flip-Flop, a reset clock signal and the master clock $F_s$; and
   a clock generator module that is driven by the master clock, $F_s$, being configured to use the control signals from the SAR control logic to determine an optimal modulation clock $F_K$ for controlling the switch $SW_K$.

2. The module according to claim 1 wherein the modulation switch $SW_K$ comprises:
   a transmission gate switch that is body biased with a reference voltage $V_{CM}$ when the switch is at an OFF-state, wherein the reference voltage $V_{CM}$ is used as the reference voltage at the non-inverting inputs of the integrator and hysteresis comparator of the ΔΣ ADC.

3. The module according to claim 1 wherein the integrator of the ΔΣ ADC comprises:
   a two-stage integrator circuit having a first and a second stage, wherein a compensation capacitor $C_C$ couples a low impedance node of the first stage to an output of the second stage.

4. The module according to claim 1 wherein the hysteresis comparator of the ΔΣ ADC comprises:
   an inverter based hysteresis comparator circuit having an inverter provided at the input of the compactor circuit, wherein a threshold voltage of the inverter is similar as threshold voltages of transistors used in the comparator circuit.

5. The module according to claim 1 wherein the 1-bit feedback current DAC comprises:
   a cascaded current mirror circuit.

6. The module according to claim 1 wherein the clock generator module comprises:
   a plurality of D-type Flip Flop, logic AND gate pairs and a logic OR gate, configured in a frequency divider configuration to generate a modulation pulse.

7. A method for converting current to digital signals using a current-to-digital converter module having a modulation switch $SW_K$, a delta-sigma analogue-to-digital converter, ΔΣ ADC, comprising an integrator coupled to a hysteresis comparator that is coupled to a D-type Flip-Flop being driven by a master clock, $F_s$, a successive-approximation-register (SAR) control logic, and a clock generator module that is driven by the master clock, $F_s$, the method comprising:
   modulating, using the modulation switch, $SW_K$, an input current, $I_{IN}$, to produce a scaled current, $I_{INK}$, wherein the switch $SW_K$ is controlled by a modulation clock $F_K$;
   coupling an inverting output from the D-type Flip-Flop an inverting input of the integrator using a 1-bit feedback current digital-to-analogue converter, DAC, generating, using the ΔΣ ADC, digital outputs at a non-inverting output and the inverting output of the D-type Flip-Flop based on a balanced current, $I_{BAL}$, received at the inverting input of the integrator, whereby the balanced current $I_{BAL}$ comprises a summation of the scaled current $I_{INK}$ with a reference current, $I_{REF}$, produced by the 1-bit feedback current DAC;
   generating, using the SAR control logic, control signals based on the non-inverting outputs from the D-type Flip-Flop, a reset clock signal and the master clock $F_s$; and
   determining, using a clock generator module, based on the control signals from the SAR control logic an optimal modulation clock $F_K$ for controlling the switch $SW_K$.

8. The method according to claim 7 wherein the modulation switch $SW_K$ comprises:
   a transmission gate switch that is body biased with a reference voltage $V_{CM}$ when the switch is at an OFF-state, wherein the reference voltage $V_{CM}$ is used as the reference voltage at the non-inverting inputs of the integrator and hysteresis comparator of the ΔΣ ADC.

9. The method according to claim 7 wherein the integrator of the ΔΣ ADC comprises:
   a two-stage integrator circuit having a first and a second stage, wherein a compensation capacitor $C_C$ couples a low impedance node of the first stage to an output of the second stage.

10. The method according to claim 7 wherein the hysteresis comparator of the ΔΣ ADC comprises:
    an inverter based hysteresis comparator circuit having an inverter provided at the input of the compactor circuit, wherein a threshold voltage of the inverter is similar as threshold voltages of transistors used in the comparator circuit.

11. The method according to claim 7 wherein the 1-bit feedback current DAC comprises a cascaded current mirror circuit.

12. The method according to claim 7 wherein the clock generator module comprises:
    a plurality of D-type Flip Flop, logic AND gate pairs and a logic OR gate, configured in a frequency divider configuration to generate a modulation pulse.

* * * * *